(12) United States Patent
Itokawa et al.

(10) Patent No.: US 7,122,851 B2
(45) Date of Patent: Oct. 17, 2006

(54) SEMICONDUCTOR DEVICE WITH PEROVSKITE CAPACITOR

(75) Inventors: Hiroshi Itokawa, Yokohama (JP); Koji Yamakawa, Tokyo (JP); Katsuaki Natori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/834,928

(22) Filed: Apr. 30, 2004

(65) Prior Publication Data

US 2005/0001251 A1   Jan. 6, 2005

(30) Foreign Application Priority Data

May 7, 2003   (JP) ............... 2003-129072

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. .................. 257/295; 257/296; 257/310
(58) Field of Classification Search ............... 257/295, 257/296, 301, 303, 306, 310
See application file for complete search history.

(56) References Cited

U.S. PATENT DOCUMENTS 6,351,006 B1   2/2002   Yamakawa et al.
6,924,519 B1 *   8/2005   Itokawa et al. ............. 257/295

FOREIGN PATENT DOCUMENTS

| JP | 11-195768 | 7/1999 |
| JP | 2000-208725 | 7/2000 |
| JP | 2000-260954 | 9/2000 |
| JP | 2004-335643 | 11/2004 |

* cited by examiner

*Primary Examiner*—Hoai Pham
(74) *Attorney, Agent, or Firm*—Oblon, Spivak, McClelland, Maier & Neustadt, P.C.

(57) ABSTRACT

A semiconductor device comprising a semiconductor substrate, and a capacitor provided above the semiconductor substrate, and including a bottom electrode, a top electrode and a dielectric film between the bottom and top electrodes, the bottom electrode including a conductive film selected from a noble metal film and a noble metal oxide film, a metal oxide film having a perovskite structure, provided between the dielectric film and the conductive film, expressed by $ABO_3$, and containing first metal element as B-site element, and a metal film provided between the conductive film and the metal oxide film, and containing second metal element which is B-site element of a metal oxide having a perovskite structure, a decrease of Gibbs free energy when the second metal element forms oxide being larger than that when the first metal element forms oxide, a thickness of the metal oxide film being 5 nm or less.

14 Claims, 8 Drawing Sheets

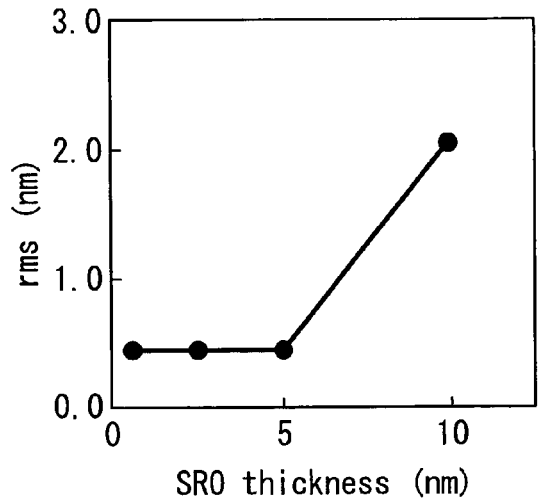
FIG. 12
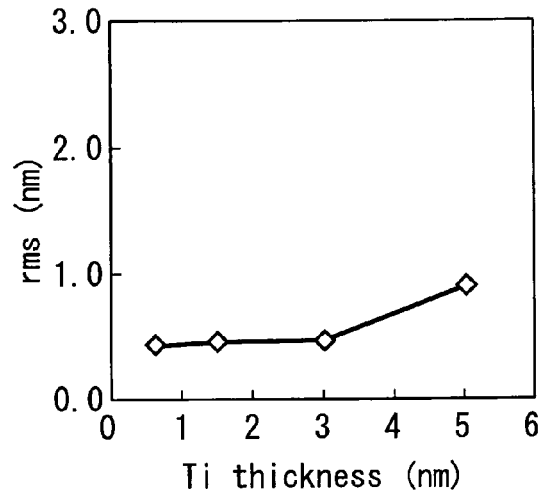
FIG. 13
| A-site elements | | B-site elements (quadrivalent) | | B-site elements (trivalent) | |
|---|---|---|---|---|---|
| Oxides | $-\Delta H[kcal/mol]$ | Oxides | $-\Delta H[kcal/mol]$ | Oxides | $-\Delta H[kcal/mol]$ |
| $La_2O_3$ | -285.7 | $TiO_2$ | -225.8 | $Ti_2O_3$ | -242.3 |
| $SrO$ | -283.0 | $NbO_3$ | -190 | $V_2O_3$ | -194.2 |
| $BaO$ | -264.6 | $VO_2$ | -170.5 | $Cr_2O_3$ | -180.0 |
| | | $MoO_2$ | -140.5 | $Mn_2O_3$ | -152.5 |
| | | $CrO_2$ | -139.2 | $Ni_2O_3$ | -77.4 |
| | | $Co_3O_4$ | -106.0 | | |
| | | $RuO_2$ | -72.8 | | |
| | | $IrO_2$ | -57.7 | | |
FIG. 14

SEMICONDUCTOR DEVICE WITH PEROVSKITE CAPACITOR

CROSS-REFERENCE TO RELATED APPLICATIONS

This application is based upon and claims the benefit of priority from prior Japanese Patent Application No. 2003-129072, filed May 7, 2003, the entire contents of which are incorporated herein by reference.

BACKGROUND OF THE INVENTION

1. Field of the Invention

The present invention relates to a semiconductor device. In particular, the present invention relates to a semiconductor device having a capacitor.

2. Description of the Related Art

Recently, there have been advanced the research and development of ferroelectric memory (FeRAM: Ferroelectric Random Access Memory) using ferroelectric film as a capacitor dielectric film.

A $Pb(Zr_xTi_{1-x})O_3$ film (PZT film) or an $SrBi_2Ta_2O_9$ film (SBT film) is given as a typical ferroelectric film used for the ferroelectric memory. PZT is a perovskite compound, and the SBT is a Bi aurivillius phase compound having a pseudo perovskite structure.

If a PZT film is used as the ferroelectric film, a conductive perovskite type metal oxide film, such as an $SrRuO_3$ film (SRO film), is used as the electrode to improve the fatigue characteristic. For example, JPN. PAT. APLLN. KOKAI Publication Nos. 2000-208725 and 2000-260954 disclose a ferroelectric capacitor using a stacked film of SRO film and Pt film as the electrode.

However, it is not easy to form a PZT film of good crystallinity and orientation on the SRO film formed on the Pt film. For this reason, it is difficult to form a capacitor, which is excellent in imprint and retention characteristics and has high reliability. The foregoing problem generally occurs in the combination of conductive perovskite type metal oxide film and noble metal film (or noble metal oxide film) in addition to the combination of SRO film and PT film.

As described above, stacked structure of the conductive perovskite type metal oxide film and the noble metal film (or noble oxide film) is applied to the capacitor electrode. In this case, it is difficult to form the conductive perovskite type metal oxide film having preferable crystallinity. Thus, it is difficult to form a dielectric film, such as PZT film, excellent in crystallinity. As a result, there is the problem of remarkably reducing capacitor characteristics and reliability.

BRIEF SUMMARY OF THE INVENTION

According to a first aspect of the present invention, there is provided a semiconductor device comprising: a semiconductor substrate; and a capacitor provided above the semiconductor substrate, and including a bottom electrode, a top electrode and. a dielectric film provided between the bottom electrode and the top electrode, the bottom electrode including: a conductive film selected from a noble metal film and a noble metal oxide film; a metal oxide film having a perovskite structure, provided between the dielectric film and the conductive film, expressed by $ABO_3$, and containing a first metal element as a B-site element; and a metal film provided between the conductive film and the metal oxide film, and containing a second metal element which is a B-site element of a metal oxide having a perovskite structure, a decrease of Gibbs free energy at a time when the second metal element forms an oxide being larger than that at a time when the first metal element forms an oxide, a thickness of the metal oxide film being 5 nm or less.

According to a second aspect of the present invention, there is provided a semiconductor device comprising: a semiconductor substrate; and a capacitor provided above the semiconductor substrate, and including a bottom electrode, a top electrode and a dielectric film provided between the bottom electrode and the top electrode, the bottom electrode including: a conductive film selected from a noble metal film and a noble metal oxide film; and a metal oxide film having a perovskite structure, provided between the dielectric film and the conductive film, expressed by $ABO_3$, and containing first and second metal elements as B-site elements, a decrease of Gibbs free energy at a time when the second metal element forms an oxide being larger than that at a time when the first metal element forms an oxide, a thickness of the metal oxide film being 5 nm or less.

BRIEF DESCRIPTION OF THE SEVERAL VIEWS OF THE DRAWING

FIG. 12 is a graph relating to the embodiment of the present invention, and showing mean roughness of SRO film surface when the thickness of SRO film is changed;

FIG. 13 is a graph relating to the embodiment of the present invention, and showing mean roughness of SRO film surface when the thickness of titanium film is changed; and FIG. 14 is a table showing generation enthalpy of oxide.

DETAILED DESCRIPTION OF THE INVENTION

Embodiments of the present invention will be described below with reference to the accompanying drawings.

(First Embodiment)

Figure 1A:
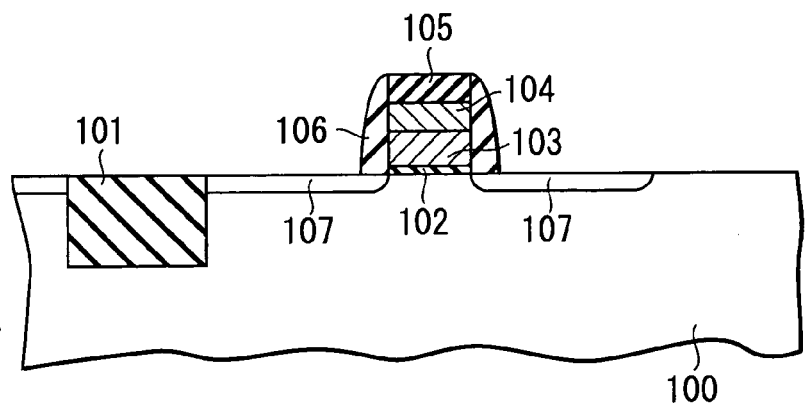
FIG. 1A to FIG. 1C are cross-sectional views showing the process of manufacturing a semiconductor device according to a first embodiment of the present invention.
Figure 1B:
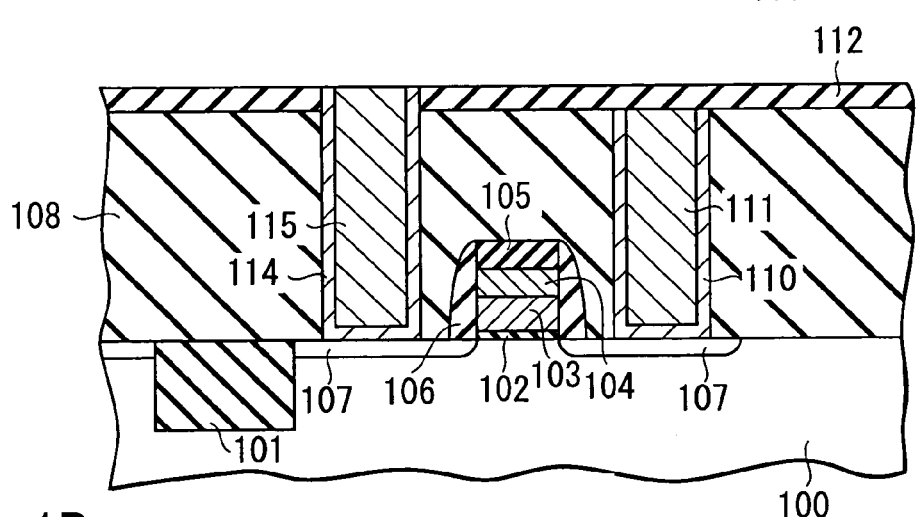
Figure 1C:
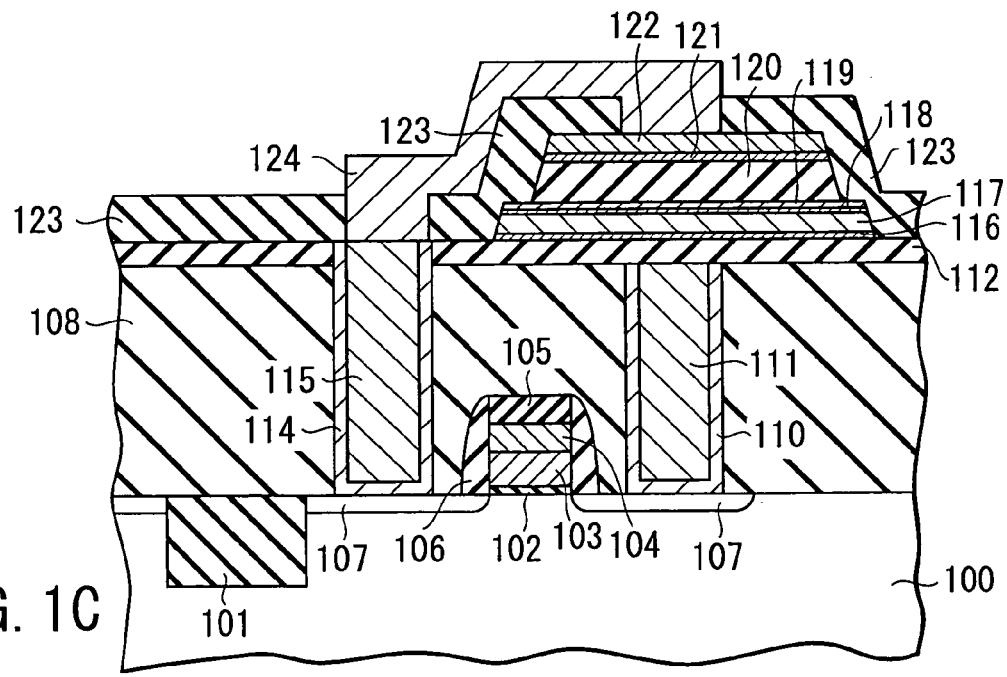

FIG. 1A to FIG. 1C are cross-sectional views showing the process of manufacturing a semiconductor device according to a first embodiment of the present invention.

As shown in FIG. 1A, an isolation region 101 having STI (Shallow Trench Isolation) structure is formed on a p-type silicon substrate (semiconductor substrate) 100. A MIS transistor is formed in the following manner.

A silicon oxide film having a thickness of about 6 nm is formed as a gate insulating film 102 by thermal oxidation. An $n^+$-type polysilicon film 103 doped with arsenic is formed on the gate insulating film 102. A $WSi_x$ film 104 and a silicon nitride film 105 are further formed on the polysilicon film 103. Thereafter, polysilicon film 103, $WSi_x$ film 104 and silicon nitride film 105 are processed by normal photolithography and RIE so that a gate electrode can be formed. A silicon nitride film 106 is deposited on the entire surface. An RIE is carried out so that a sidewall spacer formed of the silicon nitride film 106 can be formed on the sidewall of the gate electrode. In the present step, source/drain region 107 is formed by ion implantation and heat treatment, although detailed explanation is omitted.

As illustrated in FIG. 1B, a silicon oxide film 108 is deposited on the entire surface by CVD (Chemical Vapor Deposition), and further, planarized by CMP. The silicon oxide film 108 is formed with a contact hole reaching one source/drain region 107. Thereafter, a titanium film is deposited by sputtering or CVD. Heat treatment is carried out in forming gas, thereby nitriding the titanium film so that a TiN film 110 can be formed. A tungsten film 111 is deposited by CVD. TiN film 110 and tungsten film 111 other than the contact hole are removed using CMP so that TiN film 110 and tungsten film 111 remain in the contact hole. By doing so, a plug connected to one source/drain region 107 is formed. Thereafter, a silicon nitride film 112 is deposited on the entire surface by CVD. A contact hole reaching the other source/drain region 107 is further formed. According to the same process as described above, TiN film 114 and tungsten film 115 are formed in the contact hole. By doing so, a plug connected to the other source/drain region 107 is formed.

As depicted in FIG. 1C, the following films are successively deposited by sputtering. That is, a titanium film 116 having a thickness of 10 nm is formed, and a platinum film 117 having a thickness of 100 nm is formed as a noble metal film. Further, a titanium film 118 having a thickness of 2 nm is formed as metal film, and $SrRuO_3$ film (SRO film) 119 having a thickness of 2.5 nm is formed as a conductive perovskite type metal oxide film. RTA (Rapid Thermal Annealing) is carried out in oxygen atmosphere, and thereby, the SRO film 119 is crystallized. In this case, the SRO film 119 is deposited at the temperature of 550° C., and thereby, it is possible to readily form the SRO film 119 having excellent crystallinity. Thereafter, a $Pb(Zr_xTi_{1-x})O_3$ film (PZT film) 120 is formed as a capacitor dielectric film by sputtering. The PZT film 120 is crystallized by RTA in oxygen atmosphere. An SRO film 121 is deposited by sputtering. The SRO film 121 is crystallized by RTA in oxygen atmosphere. In this case, the SRO film 121 is deposited at the temperature of 550° C., and thereby, it is possible to readily form the SRO film 121 having excellent crystallinity. A platinum film 122 is deposited by sputtering.

Then, a silicon oxide film (not shown) is deposited on the entire surface by CVD. The silicon oxide film is patterned by photolithography and RIE. The foregoing platinum film 122, SRO film 121 and PZT film 120 are etched by RIE using the patterned silicon oxide film as a mask. In addition, SRO film 119, titanium film 118, platinum film 117 and titanium film 116 are patterned by photolithography and RIE.

In the manner described above, it is possible to form a ferroelectric capacitor, which includes a bottom electrode, ferroelectric film (PZT film 120) and a top electrode. The bottom electrode has the stacked structure of titanium film 116, platinum film 117, titanium film 118 and SRO film 119. The top electrode has the stacked structure of SRO film 121 and platinum film 122.

Thereafter, a silicon oxide film 123 is deposited on the entire surface by CVD. In order to recover damage occurring in the PZT film 120 in etching, heat treatment of about 650° C. is carried out under oxygen atmosphere. In addition, an interconnect 124 connecting the top electrode and the plug (tungsten film 115) is formed. Although the process after that is not shown, drive lines, bit lines and metal interconnects are formed, and thereby, a ferroelectric memory having offset structure is completed.

The characteristic improvement effect of the ferroelectric capacitor according to the embodiment will be described below with reference to FIG. 5, FIG. 6A, FIG. 6B, and FIG. 7A to FIG. 7C.

A sample was prepared as a comparative example of the embodiment. According to the sample, the following films, that is, $SiO_2$, titanium (T (thickness): 10 nm), platinum (T: 100 nm), SRO (T: 10 nm) and PZT (T: 130 nm) are successively formed on the silicon substrate. The SRO film and the PZT film were crystallized by annealing in oxygen atmosphere after forming amorphous film by sputtering. In addition, a sample was prepared as the sample corresponding to the embodiment. According to the sample, the following films, that is, $SiO_2$, titanium (T (thickness): 10 nm), platinum (T: 100 nm), titanium (T: 1.5 nm), SRO (T: 2.5 nm) and PZT (T: 130 nm) are successively formed on the silicon substrate. The SRO film was formed by sputtering of In-situ crystallization process at the substrate temperature of 550° C. The PZT film was crystallized by annealing in oxygen atmosphere after forming amorphous film by sputtering.

Figure 5:
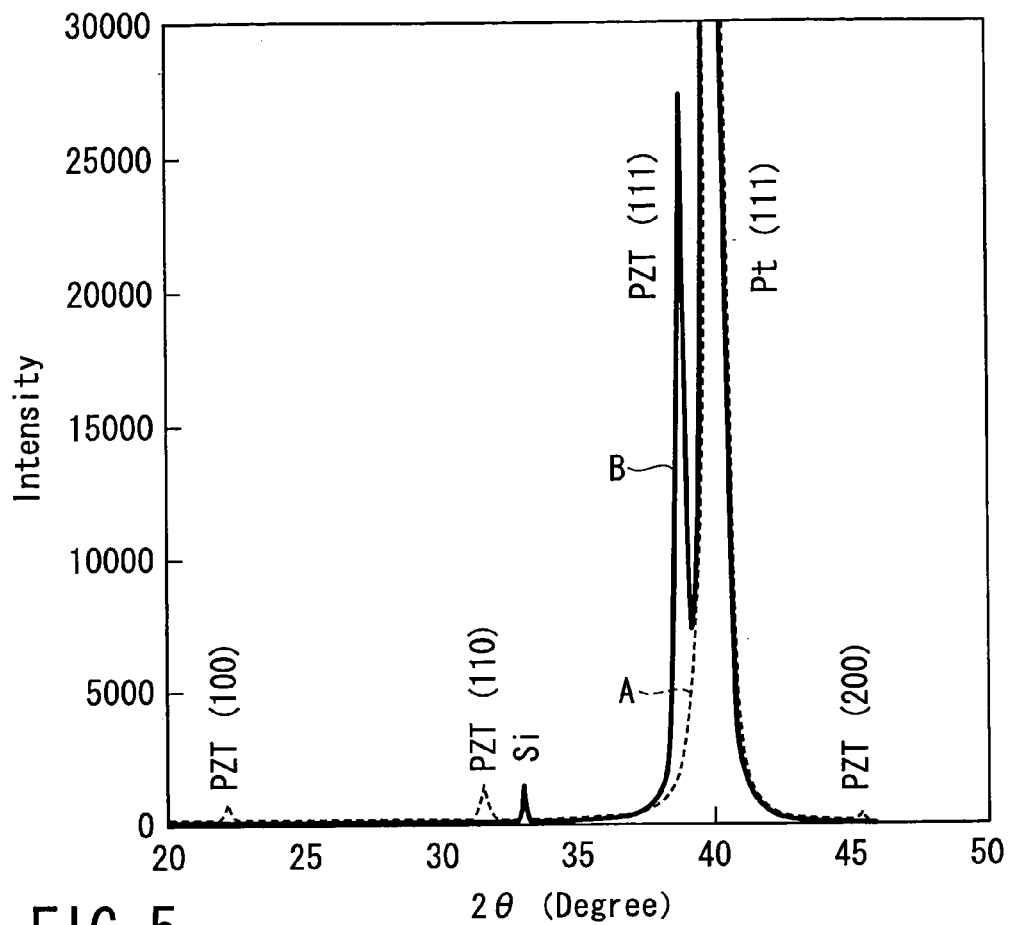
FIG. 5 is a diagram relating to embodiments of the present invention and comparative examples, and showing XRD pattern strength.

FIG. 5 shows XRD pattern of the samples thus obtained. Regarding the PZT film of the comparative example (sample A), random orientation was observed, and preferable crystallinity was not obtained. On the contrary, regarding the PZT film of the embodiment (sample B), the peak of (111) orientation was observed, and very preferable crystallinity was obtained.

Further, a sample (PZT capacitor) was prepared as a comparative example of the embodiment. According to the sample, the following films, that is, $SiO_2$, titanium (T: 10 nm), platinum (T: 100 nm), SRO (T: 10 nm), PZT (T: 130 nm), SRO (T: 10 nm) and platinum (T: 50 nm) are successively formed on the silicon substrate. A sample (PZT capacitor) was prepared as the sample corresponding to the embodiment. According to the sample, the following films, that is, $SiO_2$, titanium (T: 10 nm), platinum (T: 100 nm), titanium (T: 1.5 nm), SRO (T: 2.5 nm), PZT (T: 130 nm), SRO (T: 10 nm) and platinum (T: 50 nm) are successively formed on the silicon substrate. The SRO film was formed by sputtering of In-situ crystallization process. The PZT film was crystallized by annealing in oxygen atmosphere after forming amorphous film by sputtering.

Figure 6A:
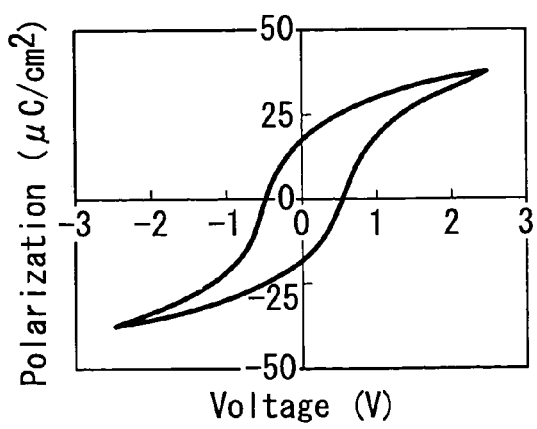
FIG. 6A is a diagram showing hysteresis characteristic relating to a comparative example of the embodiment of the present invention.
Figure 6B:
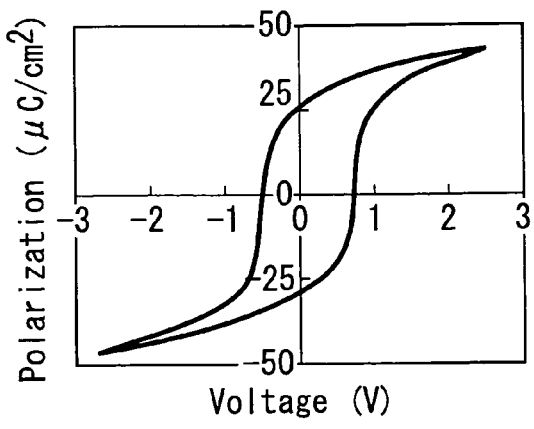
FIG. 6B is a diagram showing hysteresis characteristic relating to the embodiment of the present invention.

FIG. 6A and FIG. 6B show the hysteresis characteristic of the samples thus obtained. In the sample of the present embodiment (FIG. 6B), switching charge and squareness are greatly improved as compared with the comparative example (FIG. 6A). In this case, the squareness corresponds to a ratio (Q0/Q1) of switching charge (Q0) to non-switching charge (Q1).

Figure 7A:
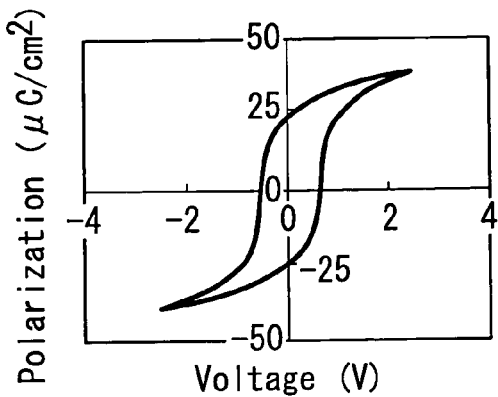
FIG. 7A to FIG. 7C are diagrams showing a change in the hysteresis characteristic relating to the embodiment of the present invention.
Figure 7B:
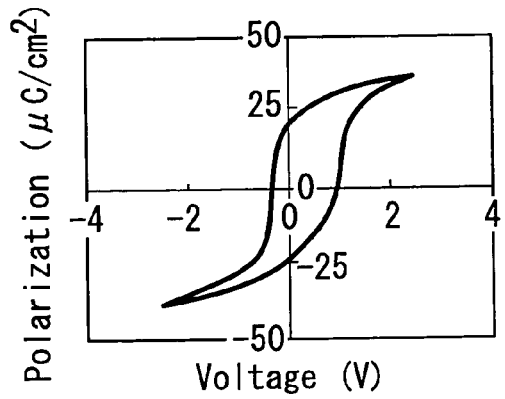
Figure 7C:
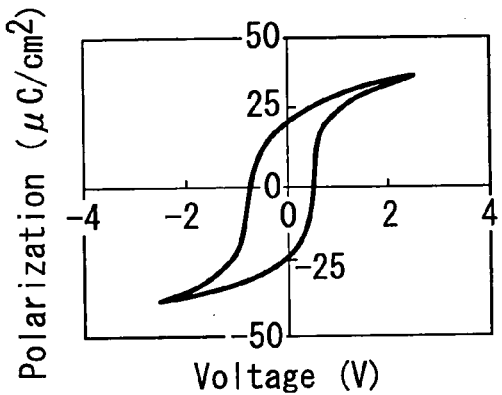

FIG. 7A to FIG. 7C show the results of reliability evaluation (static imprint test) of the sample (PZT capacitor) of the embodiment. FIG. 7A shows the hysteresis characteristic of the sample before the test. In this case, the switching charge Qsw was 44.2 $\mu C/cm^2$, and the squareness Q0/Q1 was 4.17. FIG. 7B shows the hysteresis characteristic after the sample was kept for 100 hours at the temperature of 150° C. after negative writing was performed. In this case, the switching charge Qsw was 35.9 $\mu C/cm^2$, and the squareness Q0/Q1 was 3.55. FIG. 7C shows the hysteresis characteristic after the sample was kept for 100 hours at the temperature of 150° C. after positive writing was performed. In this case, the switching charge Qsw was 39.4 $\mu C/cm^2$, and the squareness Q0/Q1 was 3.49. As seen from the results shown in FIG. 7A to FIG. 7C, the switching charge Qsw and the squareness Q0/Q1 merely reduces slightly. Therefore, it is possible to realize the PZT capacitor having preferable imprint characteristic.

As is evident from the foregoing description, the titanium film is interposed between the SRO film and the platinum film, and thereby, the capacitor characteristics can be improved. The characteristic improvement effect will be described below.

The following matter can be seen from the result of ab initio calculation of generation free energy of conductive perovskite type metal oxide. That is, the thermodynamic stability of the conductive perovskite type metal oxide (expressed by general formula $ABO_3$) is proportional to that of oxides ($BO_X$) of B-site elements. A-site elements are alkaline-earth elements, rare earth elements and the like, and form very stable oxides. Therefore, the stability of the conductive perovskite type metal oxide is determined according to that of the oxides of the B-site element.

FIG. 14 shows generation enthalpy per oxygen molecule of a simple oxide at the temperature of 25° C. in various metal elements. When the absolute value of the numerical value shown in FIG. 14 is large, the stability of oxides is high. In other words, when the absolute value of the numerical value shown in FIG. 14 is large, the decrease of Gibbs free energy when metal elements generate oxides is large.

As seen from FIG. 14, in Ru, the B-site element of SRO, the numerical value is −72.8 (kcal/mol), and in Ti, the numerical value is −225.8 (kcal/mol). Namely, Ti oxide has stability higher than Ru oxide. As described before, it can be seen that the thermodynamic stability of the conductive perovskite type metal oxide is proportional to that of the oxide of B-site element. Therefore, at least part of Ru contained in SRO is replaced with Ti, and thereby, the stability of SRO becomes higher.

If there is no existence of Ti, since the stability of SRO is low, the PZT film is formed on the SRO film, which contains much $RuO_2$ and has low crystallinity. As a result, the PZT film having preferable crystallinity cannot be obtained. According to the embodiment, the titanium film is interposed between the SRO film and the platinum film, so that part of Ru contained in the SRO film can be replaced with Ti by heat treatment. Thus, Ti is contained, and thereby, the stability of the SRO film is improved; therefore, the PZT film can be formed on the SRO film having preferable crystallinity. As a result, the crystallinity of the PZT film is improved, so that capacitor characteristics such as imprint and retention can be improved.

The following is a description on the film thickness of the SRO film and the titanium film to obtain preferable capacitor characteristics.

Figure 8:
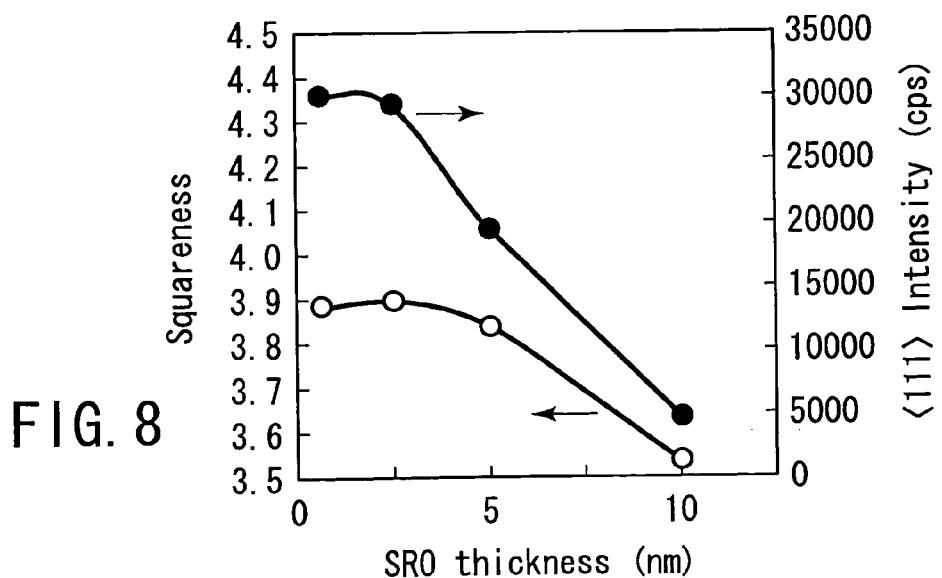
FIG. 8 is a graph relating to the embodiment of the present invention, and showing characteristic when the thickness of SRO film is changed.
Figure 9:
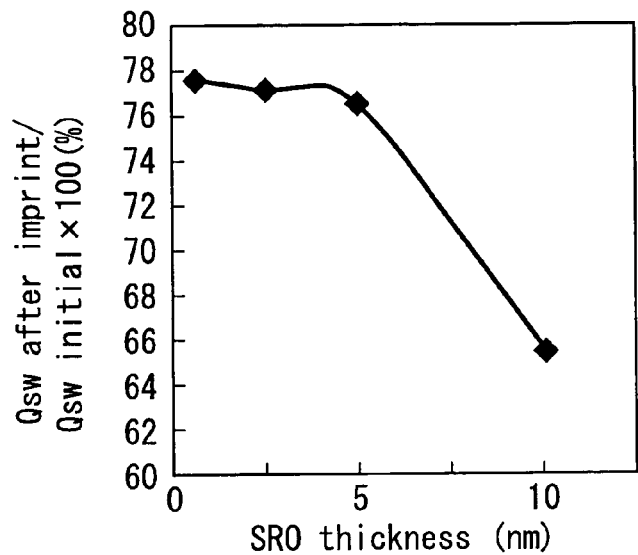
FIG. 9 is a graph relating to the embodiment of the present invention, and showing characteristic when the thickness of SRO film is changed.

FIG. 8 is a graph showing squareness Q0/Q1 and PZT (111) intensity when the thickness of the SRO film is changed. FIG. 9 is a graph showing a ratio (Qsw after imprint/Qsw initial) of switching charge (Qsw after imprint) after imprint to switching charge (Qsw initial) before imprint when the thickness of the SRO film is changed. In both cases of FIG. 8 and FIG. 9, the thickness of the titanium film is 3 nm.

As seen from FIG. 8, when the SRO film is thicker than about 5 nm, the squareness Q0/Q1 greatly reduced. In addition, as seen from FIG. 9, when the SRO film is thicker than about 5 nm, the ratio (Qsw after imprint/Qsw initial) greatly reduces. Therefore, it is desirable that the thickness of the SRO film is 5 nm or less. Further, as seen from FIG. 8, when the SRO film is thicker than about 3 nm, the PZT (111) intensity reduces. Therefore, it is desirable that the thickness of the SRO film is 3 nm or less. Unless the SRO film is formed, of course, the characteristics deteriorate. Consequently, it is preferable that the lower limit of the SRO film is a thickness equivalent to one molecule layer of the SRO film. More specifically, it is preferable that the thickness of the SRO film is 0.4 nm or more. The thickness described above is applied to conductive perovskite type metal oxides other than the SRO film, likewise.

Figure 10:
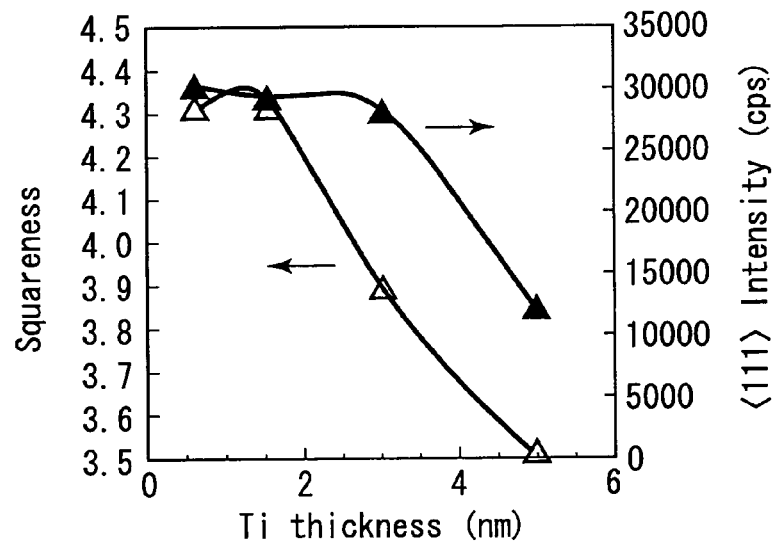
FIG. 10 is a graph relating to the embodiment of the present invention, and showing characteristic when the thickness of titanium film is changed.
Figure 11:
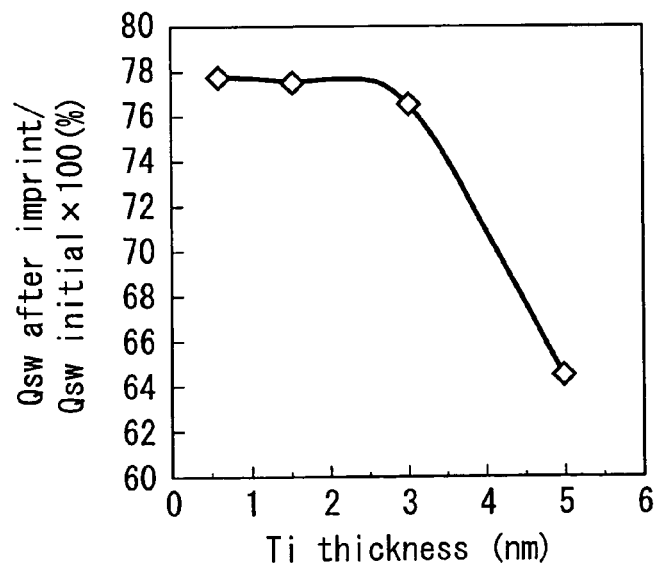
FIG. 11 is a graph relating to the embodiment of the present invention, and showing characteristic when the thickness of titanium film is changed.

FIG. 10 is a graph showing squareness Q0/Q1 and PZT (111) intensity when the thickness of the titanium film is changed. FIG. 11 is a graph showing a ratio (Qsw after imprint/Qsw initial) of switching charge (Qsw after imprint) after imprint to switching charge (Qsw initial) before imprint when the thickness of SRO film is changed. In both cases of FIG. 10 and FIG. 11, the thickness of the SRO film is 2.5 nm.

As seen from FIG. 10, when the titanium film is thicker than about 3 nm, the PZT (111) intensity greatly reduces. As seen from FIG. 11, when the titanium film is more than 3 nm, the ratio (Qsw after imprint/Qsw initial) greatly reduces. Therefore, it is desirable that the thickness of the titanium film is 3 nm or less. In addition, as seen from FIG. 10, when the thickness of the titanium film is thicker than about 2 nm, the squareness Q0/Q1 reduces. Therefore, it is preferable that the thickness of the titanium film is 2 nm or less. Unless the titanium film is formed, of course, the characteristics deteriorate. Consequently, it is preferable that the lower limit of the titanium film is a thickness equivalent to one molecule layer of the titanium film. More specifically, it is preferable that the thickness of the titanium film is 0.06 nm or more. The thickness described above is also applied to metal films formed of metal elements other than titanium, described later.

FIG. 12 is a graph showing mean roughness of the SRO film surface when the thickness of the SRO film is changed. In this case, the roughness is expressed by rms (root-mean-square). The thickness of the titanium film is 3 nm. As seen from FIG. 12, when the thickness of the SRO film is thicker than 5 nm, the mean roughness of the SRO film surface increases. However, when the thickness of the SRO film is less than 5 nm, the mean roughness of the SRO film surface has a constant value of less than 0.5 nm.

FIG. 13 is a graph showing mean roughness of an SRO film surface when the thickness of the titanium film is changed. The thickness of the SRO film is 2.5 nm. As seen from FIG. 13, when the thickness of the titanium film is thicker than 3 nm, the mean roughness of the SRO film surface increases. However, when the thickness of the SRO film is less than 3 nm, the mean roughness of the SRO film surface has a constant value of less than 0.5 nm.

Based on the foregoing result, it is preferable that the mean roughness (average roughness) of the SRO film surface is less than 0.5 nm.

As described above, in the embodiment, the titanium film is interposed between the SRO film and the platinum film, and the thickness of the SRO film is set to 5 nm or less. By doing so, the stability and crystallinity of the SRO film are improved. As a result, it is possible to form a PZT film having. excellent crystallinity on the SRO film, and thus, to provide a capacitor having excellent characteristics and reliability. In addition, the thickness of the titanium film is set to 3 nm or less, and thereby, the characteristics and reliability of the capacitor can be securely improved.

(Second Embodiment)

Figure 2A:
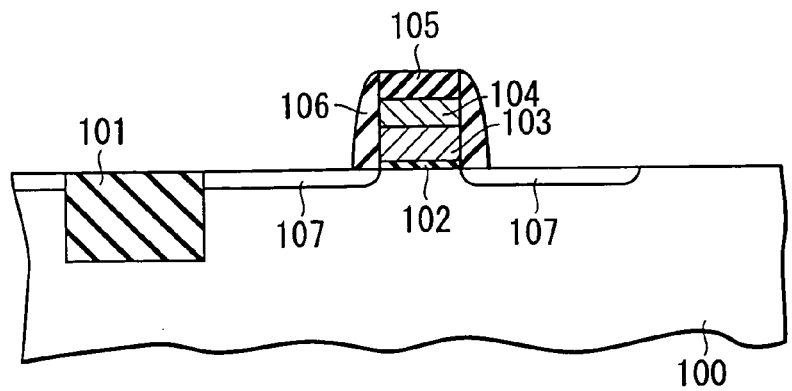
FIG. 2A to FIG. 2C are cross-sectional views showing the process of manufacturing a semiconductor device according to a second embodiment of the present invention.
Figure 2B:
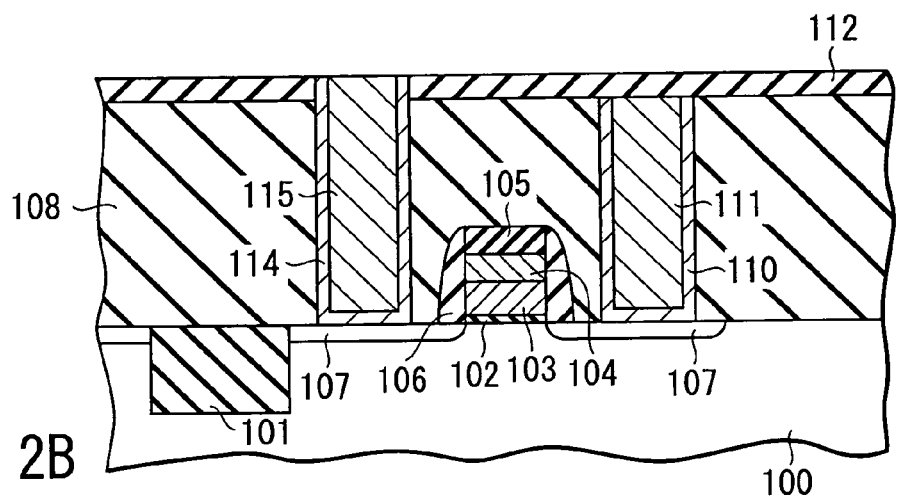
Figure 2C:
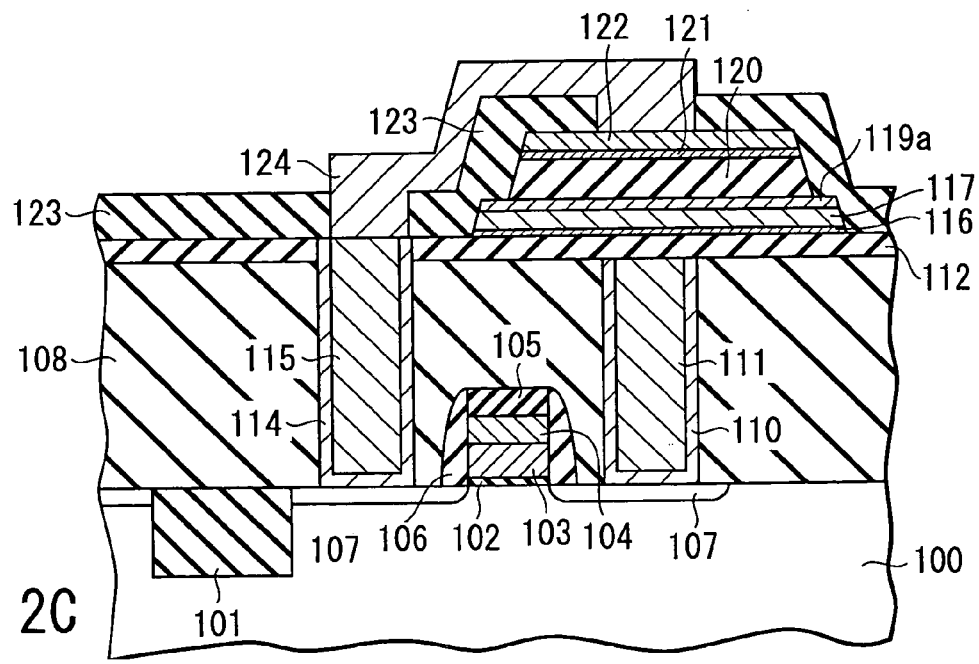

FIG. 2A to FIG. 2C are cross-sectional views showing the process of manufacturing a semiconductor device according to a second embodiment of the present invention.

The processes of FIG. 2A and FIG. 2B are substantially the same as FIG. 1A and FIG. 1B of the first embodiment; therefore, the explanation is omitted.

After the process of FIG. 2B, as shown in FIG. 2C, the following films are successively deposited by sputtering. That is, a titanium film 116 having a thickness of 10 nm is formed, and a platinum film 117 having a thickness of 100 nm is formed as a noble metal film. Further, an SRO film (Sr(Ru,Ti)O$_3$ film) 119a doped with titanium having a thickness of 3 nm is formed as a conductive perovskite type metal oxide film by sputtering. RTA (Rapid Thermal Annealing) is carried out in oxygen atmosphere, and thereby, the SRO film 119a doped with titanium is crystallized. In this case, the SRO film 119a is deposited at the temperature of 550° C., and thereby, it is possible to readily form the SRO film 119a having excellent crystallinity. Thereafter, a Pb(Zr$_x$Ti$_{1-x}$)O$_3$ film (PZT film) 120 is formed as a capacitor dielectric film by sputtering. The PZT film 120 is crystallized by RTA in oxygen atmosphere. An SRO film 121 is deposited by sputtering. The SRO film 121 is crystallized by RTA in oxygen atmosphere. In this case, the SRO film 121 is deposited at the temperature of 550° C., and thereby, it is possible to readily form the SRO film 121 having excellent crystallinity. A platinum film 122 is deposited by sputtering.

Then, a silicon oxide film (not shown) is deposited on the entire surface by CVD. The silicon oxide film is patterned by photolithography and RIE. The foregoing platinum film 122, SRO film 121 and PZT film 120 are etched by RIE using the patterned silicon oxide film as a mask. In addition, SRO film 119a doped with titanium, platinum film 117 and titanium film 116 are patterned by photolithography and RIE.

In the manner described above, it is possible to form a ferroelectric capacitor, which includes a bottom electrode, ferroelectric film (PZT film 120) and a top electrode. The bottom electrode has a stacked structure of titanium film 116, platinum film 117 and SRO film 119a doped with titanium. The top electrode has a stacked structure of SRO film 121 and platinum film 122.

Thereafter, a silicon oxide film 123 is deposited on the entire surface by CVD. In order to recover the damage occurring in the PZT film 120 in etching, heat treatment of about 650° C. is carried out under oxygen atmosphere. In addition, an interconnect 124 connecting the top electrode and the plug (tungsten film 115) is formed. Although the process after that is not shown, drive lines, bit lines and metal interconnects are formed, and thereby, a ferroelectric memory having an offset structure is completed.

As described above, in the embodiment, the stacked structure of the SRO film doped with titanium and the platinum film is employed. Thus, the characteristics when the thickness of the SRO film is changed have the same tendency as shown in FIG. 8 and FIG. 9. Therefore, it is desirable in the second embodiment that the thickness of the SRO film is set to 5 nm or less, preferably 3 nm or less, like the first embodiment. In addition, it is desirable that the thickness of the SRO film is 0.4 nm or more. The thickness described above is applied to conductive perovskite type metal oxides other than the SRO film, likewise.

Consequently, in the second embodiment, it is possible to improve the stability and crystallinity of the SRO film, and thus, to form a capacitor having excellent characteristics and reliability, based on the same reason as described in the first embodiment.

(Third Embodiment)

Figure 3A:
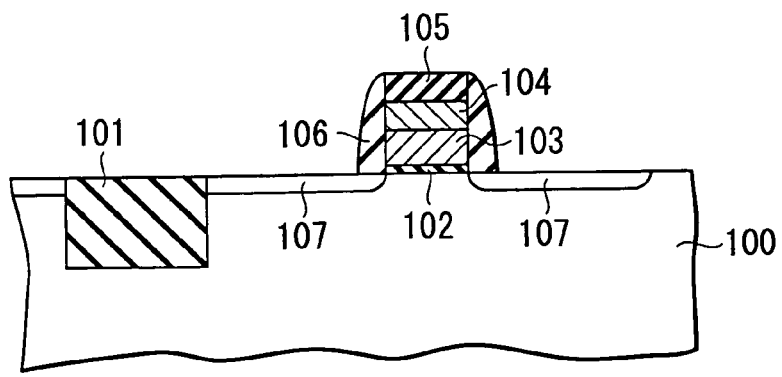
FIG. 3A to FIG. 3C are cross-sectional views showing the process of manufacturing a semiconductor device according to a third embodiment of the present invention.
Figure 3B:
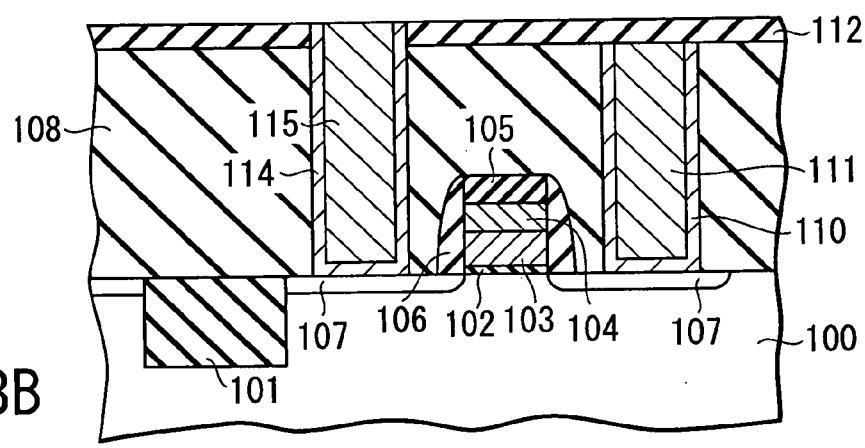
Figure 3C:
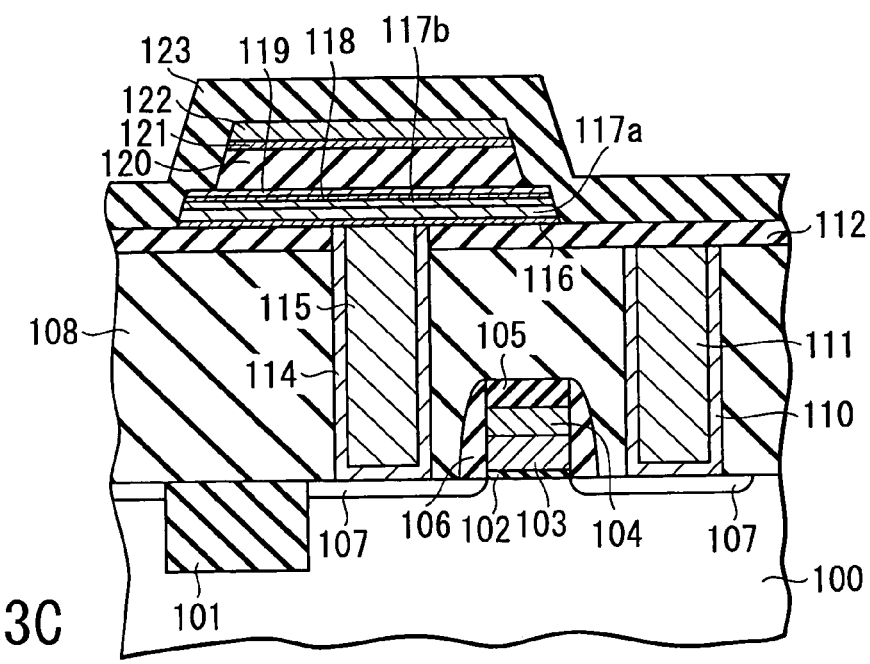

FIG. 3A to FIG. 3C are cross-sectional views showing the process of manufacturing a semiconductor device according to a third embodiment of the present invention.

The processes of FIG. 3A and FIG. 3B are substantially the same as FIG. 1A and FIG. 1B of the first embodiment; therefore, the explanation is omitted.

After the process of FIG. 3B, as shown in FIG. 3C, the following films are successively deposited by sputtering. That is, a titanium film 116 having a thickness of 10 nm is formed, and iridium film 117a having a thickness of 100 nm is formed as a noble metal film. Further, a platinum film 117b having a thickness of 50 nm is formed as a noble metal film, and a titanium film 118 having a thickness of 2 nm is formed as a metal film. Further, an SrRuO$_3$ film (SRO film) 119 having a thickness of 3 nm is formed as a conductive perovskite type metal oxide film. RTA (Rapid Thermal Annealing) is carried out in oxygen atmosphere, and thereby, the SRO film 119 is crystallized. In this case, the SRO film 119 is deposited at the temperature of 550° C., and thereby, it is possible to readily form the SRO film 119 having excellent crystallinity. Thereafter, a Pb(Zr$_x$Ti$_{1-x}$)O$_3$ film (PZT film) 120 is formed as a capacitor dielectric film by sputtering. The PZT film 120 is crystallized by RTA in oxygen atmosphere. An SRO film 121 is deposited by sputtering. The SRO film 121 is crystallized by RTA in oxygen atmosphere. In this case, the SRO film 121 is deposited at the temperature of 550° C., and thereby, it is possible to readily form the SRO film 121 having excellent crystallinity. A platinum film 122 is deposited by sputtering.

Then, a silicon oxide film (not shown) is deposited on the entire surface by CVD. The silicon oxide film is patterned by photolithography and RIE. The foregoing platinum film 122, SRO film 121 and PZT film 120 are etched by RIE using the patterned silicon oxide film as a mask. In addition, SRO film 119, titanium film 118, platinum film 117b, iridium film 117a and titanium film 116 are patterned by photolithography and RIE.

In the manner described above, it is possible to form a ferroelectric capacitor, which includes a bottom electrode, ferroelectric film (PZT film 120) and an top electrode. The bottom electrode has the stacked structure of titanium film 116, iridium film 117a, platinum film 117b, titanium film 118 and SRO film 119. The top electrode has the stacked structure of SRO film 121 and platinum film 122.

Thereafter, a silicon oxide film 123 is deposited on the entire surface by CVD. In order to recover the damage occurring in the PZT film 120 in etching, a heat treatment of about 650° C. is carried out under oxygen atmosphere. In the heat treatment, oxygen reaches the lower portion of the PZT film 120; however, the iridium film 117a has an oxygen barrier effect, so that the tungsten plug 115 can be prevented from being oxidized. Although the process after that is not shown, contacts connected to the tungsten film 111, drive lines, bit lines and metal interconnects are formed, and thereby, a ferroelectric memory having COP (Capacitor On Plug) structure is completed.

In the embodiment, the stacked structure of SRO, titanium, platinum and iridium films is employed, and the characteristics when the thickness of the SRO film is changed have the same tendency as FIG. 8 and FIG. 9. Therefore, it is preferable in the third embodiment that the thickness of the SRO film is set to 5 nm or less, preferably 3 nm or less, like the first embodiment. In addition, it is preferable that the thickness of the SRO film is 0.4 nm or more. The thickness described above is applied to conductive perovskite type metal oxides other than the SRO film, likewise. The characteristics when the thickness of the titanium film is changed have the same tendency as FIG. 10 and FIG. 11. Therefore, it is preferable in the third embodiment that the thickness of the titanium film is set to 3 nm or less, preferably 2 nm or less, like the first embodiment. In addition, it is preferable that the thickness of the titanium film is 0.06 nm or more. The thickness described above is also applied to metal films formed of metal elements other than titanium, described later.

Consequently, in the third embodiment, it is possible to improve the stability and crystallinity of the SRO film, and thus, to form a capacitor having excellent characteristics and reliability, based on the same reason as described in the first embodiment.

(Fourth Embodiment)

Figure 4A:
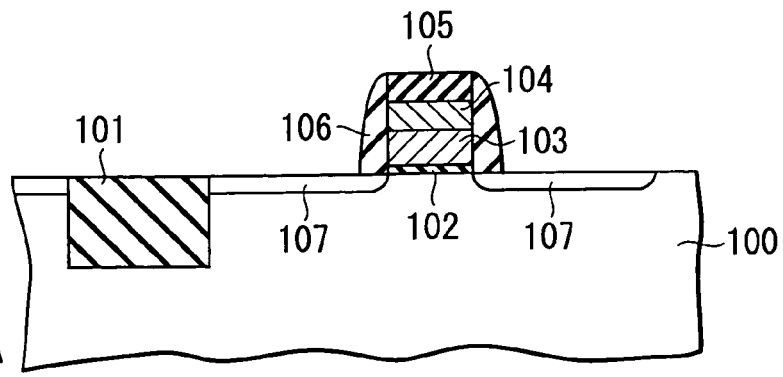
FIG. 4A to FIG. 4C are cross-sectional views showing the process of manufacturing a semiconductor device according to a fourth embodiment of the present invention.
Figure 4B:
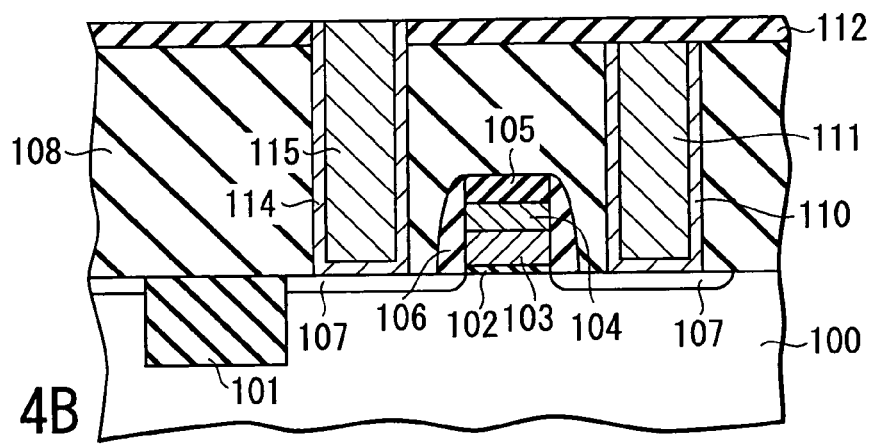
Figure 4C:
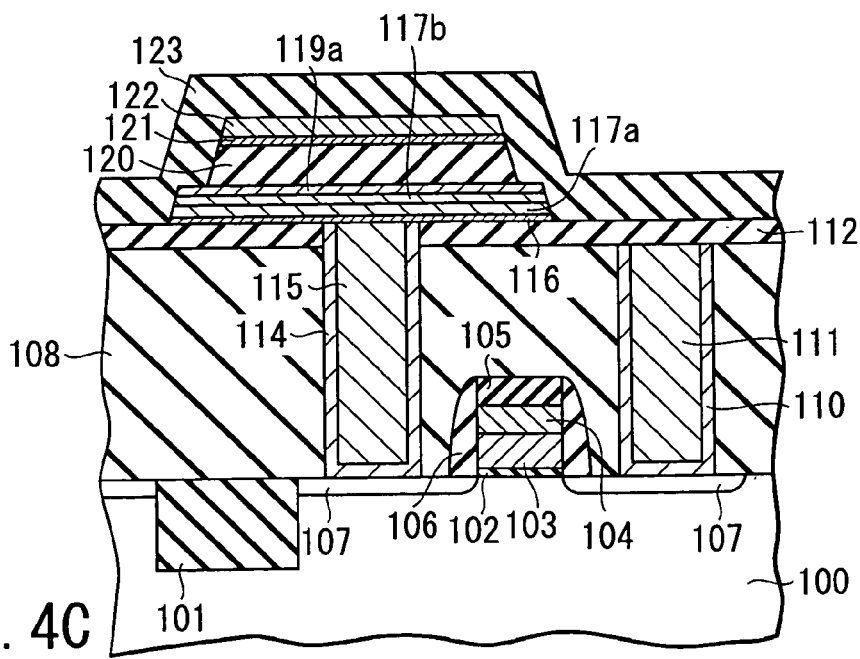

FIG. 4A to FIG. 4C are cross-sectional views showing the process of manufacturing a semiconductor device according to a fourth embodiment of the present invention.

The processes of FIG. 4A and FIG. 4B are substantially the same as FIG. 1A and FIG. 1B of the first embodiment; therefore, the explanation is omitted.

After the process of FIG. 4B, as shown in FIG. 4C, the following films are successively deposited by sputtering. That is, a titanium film 116 having a thickness of 10 nm is formed, and iridium film 117a having a thickness of 100 nm is formed as a noble metal film. Further, a platinum film 117b having a thickness of 50 nm is formed as a noble metal film. Further, an SRO film (Sr(Ru,Ti)O$_3$ film) 119a doped with titanium having a thickness of 3 nm is formed as a conductive perovskite type metal oxide film by sputtering. RTA (Rapid Thermal Annealing) is carried out in oxygen atmosphere, and thereby, the SRO film 119a doped with titanium is crystallized. In this case, the SRO film 119 is deposited at the temperature of 550° C., and thereby, it is possible to readily form the SRO film 119a having excellent crystallinity. Thereafter, a Pb(Zr$_x$Ti$_{1-x}$)O$_3$ film (PZT film) 120 is formed as a capacitor dielectric film by sputtering. The PZT film 120 is crystallized by RTA in oxygen atmosphere. An SRO film 121 is deposited by sputtering. The SRO film 121 is crystallized by RTA in oxygen atmosphere. In this case, the SRO film 121 is deposited at the temperature of 550° C., and thereby, it is possible to readily form the SRO film 121 having excellent crystallinity. A platinum film 122 is deposited by sputtering.

Then, a silicon oxide film (not shown) is deposited on the entire surface by CVD. The silicon oxide film is patterned by photolithography and RIE. The foregoing platinum film 122, SRO film 121 and PZT film 120 are etched by RIE using the patterned silicon oxide film as a mask. In addition, SRO film 119a doped with titanium, platinum film 117b, iridium film 117a and titanium film 116 are patterned by photolithography and RIE.

In the manner described above, it is possible to form a ferroelectric capacitor, which includes a bottom electrode, ferroelectric film (PZT film 120) and a top electrode. The bottom electrode has the stacked structure of titanium film 116, iridium film 117a, platinum film 117b and SRO film 119a doped with titanium. The top electrode has the stacked structure of SRO film 121 and platinum film 122.

Thereafter, a silicon oxide film 123 is deposited on the entire surface by CVD. In order to recover the damage occurring in the PZT film 120 in etching, a heat treatment of about 650° C. is carried out under an oxygen atmosphere. In the heat treatment, oxygen reaches the lower portion of the PZT film 120; however, the iridium film 117a has an oxygen barrier effect, so that the tungsten plug 115 can be prevented from being oxidized. Although the process after that is not shown, contacts connected to the tungsten film 111, drive lines, bit lines and metal interconnects are formed, and thereby, a ferroelectric memory having a COP (Capacitor On Plug) structure is completed.

In the embodiment, the stacked structure of SRO doped with titanium, platinum and iridium films is employed, and the characteristics when the thickness of the SRO film is changed have the same tendency as FIG. 8 and FIG. 9. Therefore, it is preferable in the fourth embodiment that the thickness of the SRO film is set to 5 nm or less, preferably 3 nm or less, like the first embodiment. In addition, it is preferable that the thickness of the SRO film is 0.4 nm or more. The thickness described above is applied to conductive perovskite type metal oxides other than the SRO film, likewise.

Consequently, in the fourth embodiment, it is possible to improve the stability and crystallinity of the SRO film, and thus, to form a capacitor having excellent characteristics and reliability, based on the same reason as described in the first embodiment.

In the first to fourth embodiments, the following various modifications may be made.

In the first to fourth embodiments, the SRO film is used as a conductive perovskite type metal oxide film. In this case, (La,Sr)CoO$_3$ film, BaRuO$_3$ film or LaNiO$_3$ film may be used. In general, conductive perovskite type metal oxide film containing at least one of B-site elements, that is, Ru, Co and Ni may be used.

In the first and second embodiment, the platinum film (Pt film) is used as a noble metal film (conductive film). In the third and fourth embodiments, the platinum film and the iridium film (Ir film) are used as a noble metal film (conductive film). In this case, ruthenium film (Ru film) is also given as the noble metal film. In place of the noble metal film, noble metal oxide film such as an iridium oxide film (IrO$_2$ film) or ruthenium oxide film (RuO$_2$ film) may be used.

In the first and third embodiments, a titanium film (Ti film) is used as the metal film; on the other hand, in the second and fourth embodiment, an SRO film doped with titanium (Ti) is used. In this case, metal elements other than Ti may be used as the second metal element. If the B-site element of conductive perovskite type metal oxide films such as SrRuO$_3$ film is set as the first metal element, the decrease of Gibbs free energy has the following relation. That is, the decrease of Gibbs free energy when the second metal element generates oxide is larger than the decrease of Gibbs free energy when the first metal element generates oxide. More specifically, V, W, Zr, Cr, Mg, Hf, Mo, Mn, Ta or Nb is applicable as the second metal element, in addition to Ti.

In the first to fourth embodiments, a PZT film (Pb$(Zr_xTi_{1-x})O_3$ film) is used as the dielectric film (ferroelectric film). In this case, SBT ($SrBi_2Ta_2O_9$ film) may be used. In general, a perovskite compound film or Bi aurivillius phase compound film may be used. In addition, a high dielectric constant film may be used as the dielectric film.

In the first to fourth embodiments, a tungsten plug is used as the plug; in this case, a polysilicon plug may be used.

In the first and third embodiments, the noble metal film, metal oxide film and metal film are formed by sputtering method. These films may be formed by CVD or sol-gel method. In the second and fourth embodiments, the noble metal film and metal oxide film are formed by sputtering method. These films may be formed by CVD or sol-gel method.

If the metal oxide film is formed by sputtering, it is preferable that the substrate temperature be set to 400° C. or more. In this case, sputtering may be carried out in a mixed gas atmosphere of inert gas and oxygen gas. In addition, sputtering may be carried out in a mixed gas atmosphere having oxygen gas concentration of 40% or less.

The processes described in the first to fourth embodiments are applicable to a DRAM, in addition to an FeRAM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate; and
   a capacitor provided above the semiconductor substrate, and including a bottom electrode, a top electrode and a dielectric film provided between the bottom electrode and the top electrode,
   the bottom electrode including:
   a conductive film selected from a noble metal film and a noble metal oxide film;
   a metal oxide film having a perovskite structure, provided between the dielectric film and the conductive film, expressed by $ABO_3$, and containing a first metal element as a B-site element; and a metal film provided between the conductive film and the metal oxide film, and containing a second metal element which is a B-site element of a metal oxide having a perovskite structure,
   a decrease of Gibbs free energy at a time when the second metal element forms an oxide being larger than that at a time when the first metal element forms an oxide,
   a thickness of the metal oxide film being 5 nm or less.

2. The device according to claim 1, wherein a thickness of the metal film is 3 nm or less.

3. The device according to claim 1, wherein the second metal element is selected from Ti, V, W, Zr, Cr, Mg, Hf, Mo, Mn, Ta and Nb.

4. The device according to claim 1, wherein the first metal element is selected from Ru, Co and Ni.

5. The device according to claim 1, wherein the metal oxide film contains at least one of Ru, Co and Ni.

6. The device according to claim 1, wherein the conductive film is selected from iridium film, iridium oxide film, ruthenium film, ruthenium oxide film and platinum film.

7. The device according to claim 1, wherein the dielectric film includes a compound film having a perovskite structure or a Bi aurivillius phase structure.

8. The device according to claim 1, wherein the dielectric film contains Pb.

9. The device according to claim 1, wherein a surface roughness of the metal oxide film is 0.5 nm or less.

10. The device according to claim 1, further comprising an intermediate region provided between the semiconductor substrate and the capacitor, and including a plug electrically connected to the bottom electrode or the top electrode.

11. The device according to claim 10, further comprising a transistor provided on the semiconductor substrate, and electrically connected to the plug.

12. The device according to claim 1, wherein at least one of the conductive film, the metal oxide film and the metal film is formed by a sputtering, CVD or sol-gel method.

13. The device according to claim 1, wherein the metal oxide film is formed of an SRO film.

14. The device according to claim 13, wherein the metal film is formed of a Ti film.

* * * * *